(12) United States Patent
Aipperspach et al.

(10) Patent No.: US 6,538,522 B1
(45) Date of Patent: Mar. 25, 2003

(54) METHOD AND RING OSCILLATOR FOR EVALUATING DYNAMIC CIRCUITS

(75) Inventors: Anthony Gus Aipperspach, Rochester, MN (US); Todd Alan Christensen, Rochester, MN (US); Peter Thomas Freiburger, Rochester, MN (US); David Michael Friend, Rochester, MN (US); Nghia Van Phan, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/977,423

(22) Filed: Oct. 15, 2001

(51) Int. Cl.[7] .............................................. H03B 27/00
(52) U.S. Cl. ........................................ 331/57; 324/600
(58) Field of Search ............................ 331/57; 324/600, 324/617, 618

(56) References Cited

U.S. PATENT DOCUMENTS

| | | | | |
|---|---|---|---|---|
| 5,345,186 A | * | 9/1994 | Lesmeister | 327/105 |
| 5,451,911 A | * | 9/1995 | Colvin et al. | 331/57 |
| 6,194,971 B1 | * | 2/2001 | Glen et al. | 331/57 |

| | | | | |
|---|---|---|---|---|
| 2001/0019291 A1 | * | 9/2001 | Nakano | 331/57 |

* cited by examiner

Primary Examiner—Robert Pascal
Assistant Examiner—Joseph Chang
(74) Attorney, Agent, or Firm—Joan Pennington

(57) ABSTRACT

Measurement methods and a ring oscillator circuit are provided for evaluating dynamic circuits. The ring oscillator circuit includes a one-shot pulse generator receiving a single transition input signal and producing a pulse output signal having a rising transition and falling transition. The dynamic circuit to be evaluated is coupled to an output of the one-shot pulse generator receiving the pulse output signal of the one-shot pulse generator and producing a delayed output pulse at an output. A divide-by-two circuit is coupled to the output of the dynamic circuit to be evaluated. An output signal of the divide-by-two circuit is fed back to the one-shot pulse generator, and the cycle is repeated, thus oscillating. A multiplexer is connected between output of the dynamic circuit to be evaluated and the divide-by-two circuit. The multiplexer receives the pulse output of the one-shot pulse generator and includes a select input for selecting the output of the dynamic circuit to be evaluated or the pulse output of the one-shot pulse generator. By inserting the evaluation circuit into a path that can be multiplexed in and out of the oscillator path, and by measuring the difference between the frequency with and without the evaluation circuit in the path, the performance of the evaluation circuit can be accurately determined.

20 Claims, 5 Drawing Sheets

METHOD AND RING OSCILLATOR FOR EVALUATING DYNAMIC CIRCUITS

FIELD OF THE INVENTION

The present invention relates generally to oscillator circuits, and more particularly, relates to a ring oscillator and methods for evaluating dynamic circuits.

DESCRIPTION OF THE RELATED ART

Measuring circuit delay is an important metric of a design or technology. A common method to measure delay is connecting a series of identical circuits together into a ring so that the overall path is inverting.

Ring oscillators typically include a series of devices or stages connected together to form a ring with a feedback path provided from the output of the last of the series of devices to an input of the first of the series of devices. The devices may include logic gates, inverters, differential buffers, or differential amplifiers, for example. Any inverting path with sufficient gain will oscillate when connected in a ring, while a non-inverting path will simply lock on a particular starting logic level. The ring oscillator is essentially a series of stages, each stage having an intrinsic delay from input to output. The frequency of the ring oscillator output is a function of the total delay time of the series of stages. The steady state frequency of the oscillator is dependent on the intrinsic delay of each of the stages.

FIG. 1 illustrates this conventional ring oscillator arrangement for measuring circuit delay. This prior art ring oscillator of FIG. 1 includes a series of multiple inverting stages connected in a loop, as shown. When power is supplied, this chain will oscillate at a certain frequency that indicates the sum of the delay through the entire chain. Dividing this delay by the total number of stages provides the delay through each stage. This is a common technique to evaluate static CMOS types of circuits. For a given stage, both the delay of the input rising and the delay of the input falling contributes to the oscillation frequency. This is usually the desired result for static circuits, since designers are interested in both phases of transition since each is equally important.

However, there are classes of circuits in which the measured performance of only one of the input transitions is desired. These classes of circuits include, for example, dynamic circuits, memory access paths, and the like.

A need exists for an effective mechanism for measuring independently one of the input transitions in dynamic circuits, memory access paths, and the like. It is desirable to provide an improved method and ring oscillator for evaluating dynamic circuits.

SUMMARY OF THE INVENTION

A principal object of the present invention is to provide an improved method and ring oscillator for evaluating dynamic circuits. Other important objects of the present invention are to provide such an improved method and ring oscillator for evaluating dynamic circuits substantially without negative effect and that overcome many of the disadvantages of prior art arrangements.

In brief, measurement methods and a ring oscillator circuit are provided for evaluating dynamic circuits. The ring oscillator circuit includes a one-shot pulse generator receiving a single transition input signal and producing a pulse output signal having a rising transition and falling transition. The dynamic circuit to be evaluated is coupled to an output of the one-shot pulse generator receiving the pulse output signal of the one-shot pulse generator and producing a delayed output pulse at an output. A divide-by-two circuit is coupled to the output of the dynamic circuit to be evaluated. An output signal of the divide-by-two circuit is fed back to the one-shot pulse generator, and the cycle is repeated, thus oscillating.

In accordance with features of the invention, a multiplexer is connected between output of the dynamic circuit to be evaluated and the divide-by-two circuit. The multiplexer receives the pulse output of the one-shot pulse generator and includes a select input for selecting the output of the dynamic circuit to be evaluated or the pulse output of the one-shot pulse generator. By inserting the evaluation circuit into a path that can be multiplexed in and out of the oscillator path, and by measuring the difference between the frequency with and without the evaluation circuit in the path, the performance of the evaluation circuit can be accurately determined.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiment, a ring oscillator is implemented with predetermined circuitry to make only the delay of one of the input transitions, such as input rising, contribute to the oscillation frequency of a measured dynamic circuit.

Figure 1:
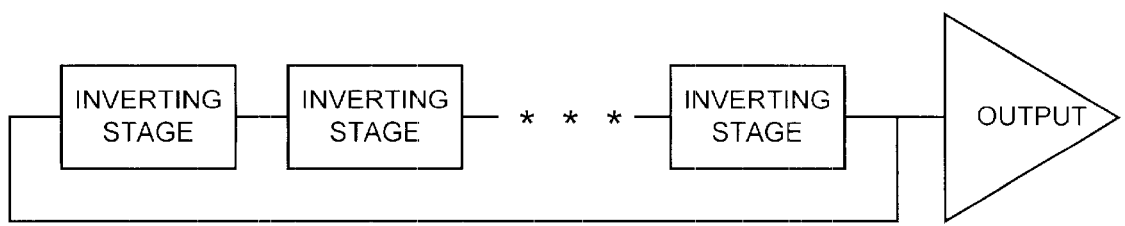
FIG. 1 is a schematic diagram representation illustrating a conventional ring oscillator arrangement for measuring circuit delay.
Figure 2:
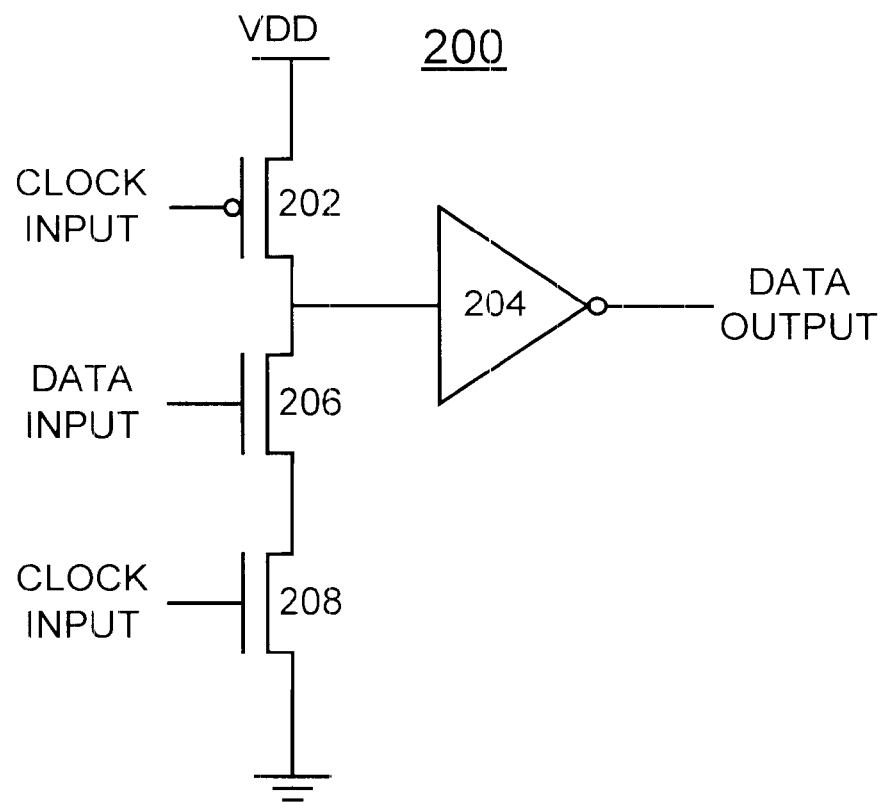
FIG. 2 is a schematic diagram illustrating an exemplary dynamic circuit in accordance with the preferred embodiment.

FIG. 2 illustrates a dynamic circuit generally designated by the reference character 200 in which performance to be measured of only one of the input transitions is desired in accordance with the preferred embodiment. As shown in FIG. 2, a precharge P-channel field effect transistor (PFET) 202 is gated by CLOCK to precharge an intermediate node coupled to an output inverter 204. A data input signal is applied to an N-channel field effect transistor (NFET) 206 connected to the intermediate node and the output inverter 204 that provides a logical output signal responsive to the data input signal during an evaluate mode. A footer device NFET 208 gated by CLOCK, is connected between the NFET 206 and ground.

Dynamic circuit 200 is typical of a class of dynamic circuits having a precharge phase that must be designed such that precharge is finished prior to the evaluation phase. It is the performance of the evaluation phase that is typically of more interest but by using the method of the preferred embodiment, the performance of the precharge phase also is evaluated. In this dynamic circuit 200, the precharge phase precharges the intermediate precharge node each clock cycle when the CLOCK input is low. The CLOCK input transitions high prior to the data input rising. The data input rises thus causing the output to transition high. The CLOCK input then transitions low causing the dynamic circuit to be precharged with the output low again.

Figure 3A:
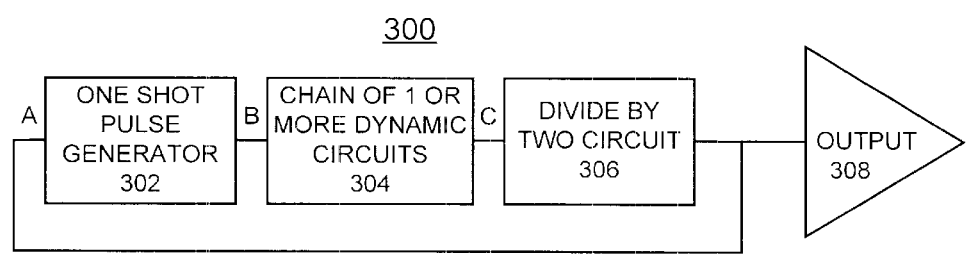
FIG. 3A is a schematic diagram representation illustrating an exemplary circuit for carrying out circuit delay measurement methods in accordance with the preferred embodiment.
Figure 3B:
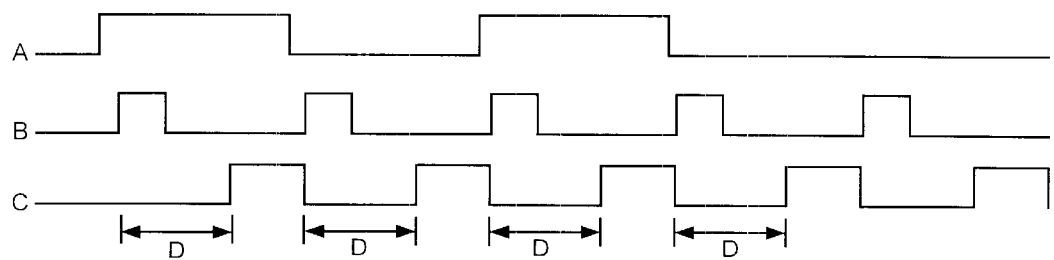
FIG. 3B is a timing diagram illustrating timing within the exemplary circuit of FIG. 3A for carrying out circuit delay measurement methods in accordance with the preferred embodiment.

Referring now to FIG. 3A, there is shown an exemplary circuit generally designated by the reference character 300 for carrying out circuit delay measurement methods in accordance with the preferred embodiment. Referring also to FIG. 3B, there is shown timing diagram illustrating timing within the exemplary circuit of FIG. 3A. Measurement circuit 300 includes a one-shot pulse generator 302 coupled to a chain of one or more dynamic circuits 304 to be measured, and a divide-by-two circuit 306 having an output coupled to an output stage 308 and the one-shot pulse generator 302. The chain of one or more dynamic circuits 304 to be measured includes various dynamic circuits, such as the dynamic circuit 200 of FIG. 2 and a dynamic circuit 500 as illustrated and described with respect to FIG. 5.

A single transition either high or low at node A is applied at the input of a one-shot pulse generator 302, producing both a rising and falling transition at the output node B of the one-shot pulse generator 302. The pulse propagates through the circuitry 304 of interest and a delayed pulse appears at the output node C. This delayed pulse now feeds into the divide-by-two circuit 306 in which the output only switches when the input rises. One must ensure that the precharge signal disables the precharge prior to the evaluation waveform arriving. The signal output of the divide-by-two circuit 306 is fed back to the input of the one-shot pulse generator 302 and the cycle is repeated, thus oscillating. In measurement circuit 300 only the delay from the rising edge input at node B to the circuit 304 of interest to the rising edge of the output node C of the circuit 304 contributes to the oscillation frequency and not the falling to falling delay. The signal at the output of output stage 308 is applied to a frequency tester (not shown) to measure the oscillation frequency. It is also common to be able to gate off the oscillation, for example, by using a NAND gate instead of an inverter in the feedback path.

In FIG. 3B, at line A the input to the one-shot pulse generator 302 at node A is shown. At line B, the output of the one-shot pulse generator 302 at node B is shown that is applied to the chain of one or more dynamic circuits 304. At line C, the output of the chain of one or more dynamic circuits 304 at node C is shown that is applied to the divide-by-two circuit 306. Arrows labeled D in FIG. 3B indicate the rising edge input at node B to the rising edge of the output node C of the circuit 304 of interest.

This measurement method of the preferred embodiment works well if the delay added by the extra circuits, such as, one shot generator 302, divide-by-two 306, and the like, is small as compared to the total delay through the measurement path of the circuit 304 of interest.

In accordance with features of the preferred embodiment, a multiplexer is provided for carrying out circuit delay measurement methods in accordance with the preferred embodiment. By inserting evaluation circuits into a path that can be multiplexed in and out of the oscillator path, and by measuring the difference between the frequency with and without the evaluation circuit in the path, the performance of the evaluation circuit can be accurately determined as illustrated and described with respect to FIG. 4.

Figure 4:
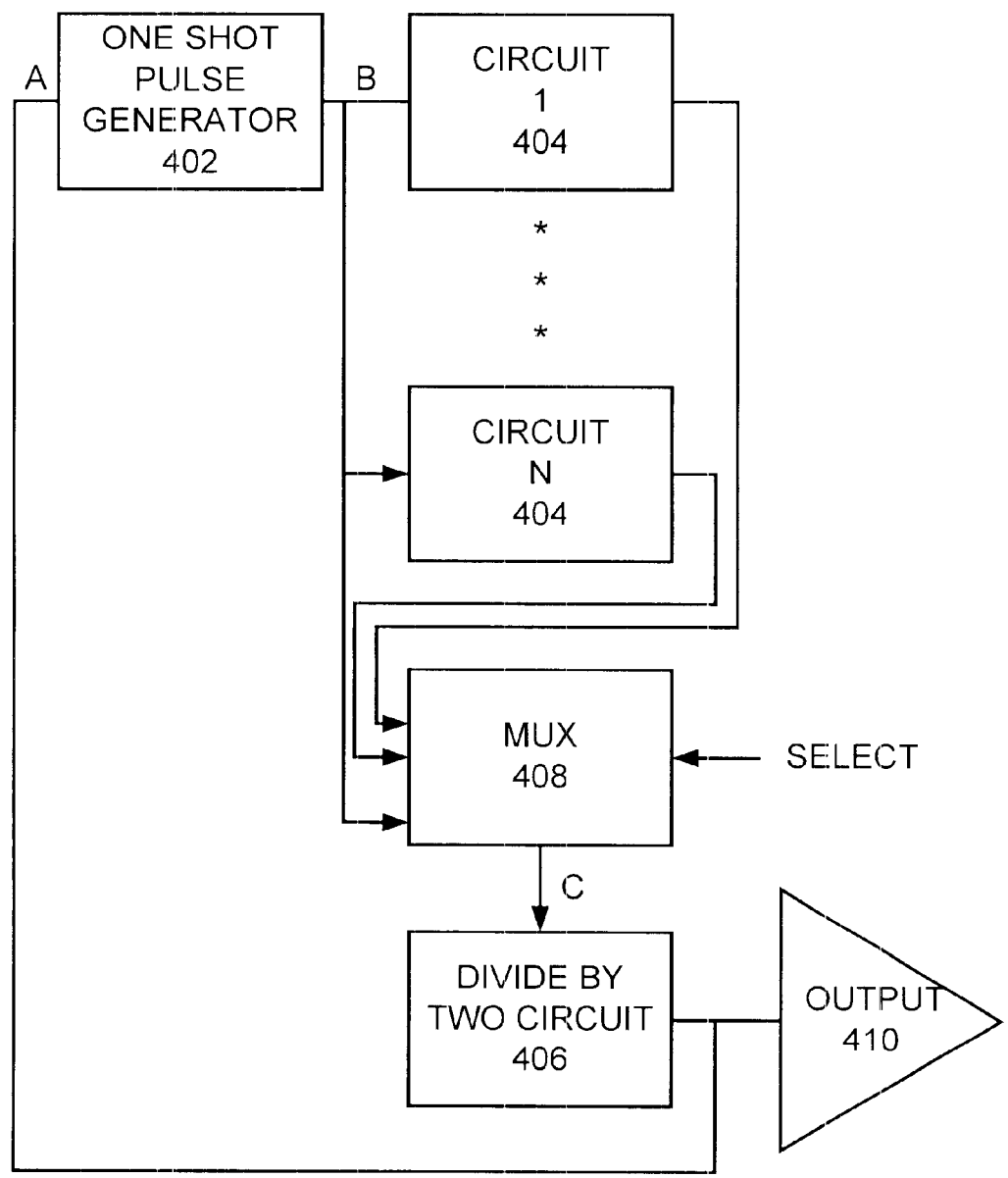
FIG. 4 is a schematic diagram representation illustrating another exemplary circuit for carrying out circuit delay measurement methods in accordance with the preferred embodiment.

Referring now to FIG. 4, there is shown a further exemplary circuit generally designated by the reference character 400 for carrying out circuit delay measurement methods in accordance with the preferred embodiment. Measurement circuit 400 includes a one-shot pulse generator 402 coupled to a plurality of dynamic circuits 404 to be measured, coupled to a divide-by-two circuit 406 by a multiplexer 408. An output of the divide-by-two circuit 406 is coupled to an output stage 408 and the one-shot pulse generator 402. A select signal is applied to the multiplexer 408 for selecting an output of one dynamic circuit 404 or the output of the one-shot pulse generator 402.

A difference between the frequency with and without the evaluation dynamic circuit 404 in the path is accurately measured utilizing the multiplexer 408 for inserting evaluation circuits 404 into a path that can be multiplexed in and out of the oscillator path.

Figure 5:
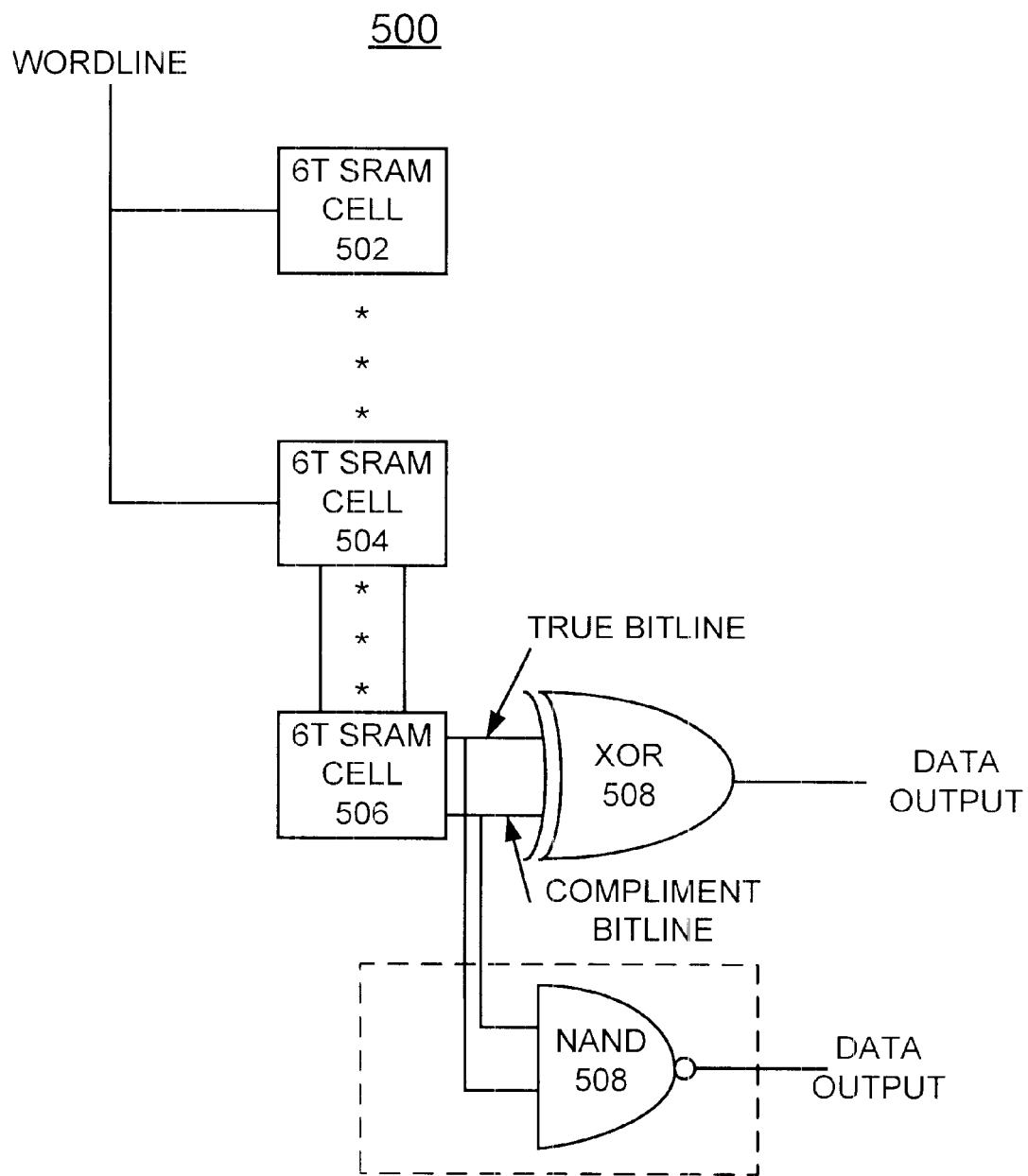
FIG. 5 is a schematic diagram representation illustrating a further exemplary static random access memory (SRAM) circuit in accordance with the preferred embodiment.

Referring now to FIG. 5, there is shown another dynamic circuit generally designated by the reference character 500 in which performance to be measured of only one of the input transitions is desired in accordance with the preferred embodiment. As shown in FIG. 5, dynamic circuit 500 includes a wordline input applied to a plurality of six-transistor static random access memory (6T SRAM) cells 502, 504. A 6T SRAM cell 506 having true and compliment bitlines applied to a two-input XOR gate 508, or alternatively to a two-input NAND gate 508.

To measure the access delay of SRAM dynamic circuit 500 with the two input XOR 508 added to the output of the true and compliment bitlines, the delay is measured from the wordline rising to the output of the XOR rising. Precharge circuitry is included to precharge both true and compliment bitlines to a high level and left floating prior to the wordlines rising. Because both bitlines are precharged high and only one of the true or compliment bitlines falls, the NAND gate 508 can be used instead of the XOR gate 508.

SRAM dynamic circuit 500 is provided within the measurement circuit 300 between the one shot pulse generator 302 and the divide-by-two circuit 306. The pulse output of the one shot pulse generator 302 propagates through the circuitry 500 of interest and a delayed pulse appears at the output of XOR gate 508 or node C. This delayed pulse now feeds into the divide-by-two circuit 306. The signal output of the divide-by-two circuit 306 is fed back to the input of the one-shot pulse generator 302 and the cycle is repeated, thus oscillating.

While the present invention has been described with reference to the details of the embodiments of the invention shown in the drawing, these details are not intended to limit the scope of the invention as claimed in the appended claims.

What is claimed is:

1. A ring oscillator circuit for evaluating a dynamic circuit comprising:
   a one-shot pulse generator receiving a single transition input signal and producing a pulse output signal having a rising transition and falling transition;
   the dynamic circuit to be evaluated coupled to an output of said one-shot pulse generator receiving said pulse output signal of said one-shot pulse generator and producing a delayed output pulse at an output;

a divide-by-two circuit coupled to said output of the dynamic circuit to be evaluated; an output signal of said divide-by-two circuit applied to said one-shot pulse generator.

2. A ring oscillator circuit for evaluating a dynamic circuit as recited in claim 1 further includes a multiplexer, said multiplexer connected between output of the dynamic circuit to be evaluated and said divide-by-two circuit.

3. A ring oscillator circuit for evaluating a dynamic circuit as recited in claim 2 wherein said multiplexer receives said pulse output of said one-shot pulse generator and includes a select input for selecting said output of the dynamic circuit to be evaluated or said pulse output of said one-shot pulse generator.

4. A ring oscillator circuit for evaluating a dynamic circuit as recited in claim 2 wherein the dynamic circuit to be evaluated includes a plurality of dynamic circuits coupled between said output of said one-shot pulse generator and said multiplexer.

5. A ring oscillator circuit for evaluating a dynamic circuit as recited in claim 1 wherein the dynamic circuit to be evaluated coupled between said output of said one-shot pulse generator and said divide-by-two circuit includes a chain of one or more dynamic circuits to be evaluated.

6. A ring oscillator circuit for evaluating a dynamic circuit as recited in claim 5 includes an output stage coupled to an output of said divide-by-two circuit.

7. A ring oscillator circuit for evaluating a dynamic circuit as recited in claim 1 includes an output stage coupled to an output of said divide-by-two circuit.

8. A ring oscillator circuit for evaluating a dynamic circuit as recited in claim 1 wherein the dynamic circuit to be evaluated includes a dynamic circuit having a precharge phase and an evaluate phase; and wherein said output signal of said divide-by-two circuit switches upon one selected input transition.

9. A ring oscillator circuit for evaluating a dynamic circuit as recited in claim 8 wherein said one selected input transition includes an input rising signal or an input falling signal.

10. A ring oscillator circuit for evaluating a dynamic circuit as recited in claim 1 wherein the dynamic circuit to be evaluated includes a static random access memory having one of a two input exclusive or (XOR) gate or a two input NAND gate connected to output true and compliment bitlines.

11. A measurement method for evaluating a dynamic circuit comprising the steps of:

applying a single transition input signal to a one-shot pulse generator and producing a pulse output signal having a rising transition and falling transition;

applying said pulse output signal of said one-shot pulse generator to the dynamic circuit to be evaluated and producing a delayed output pulse at an output of the dynamic circuit to be evaluated;

applying said delayed output pulse to a divide-by-two circuit coupled to the dynamic circuit to be evaluated; and applying an output signal of said divide-by-two circuit applied to said one-shot pulse generator to produce an oscillating signal output of said divide-by-two circuit.

12. A measurement method for evaluating a dynamic circuit as recited in claim 11 further includes the steps of applying said delayed output pulse to said divide-by-two circuit by a multiplexer; and applying said pulse output signal of said one-shot pulse generator to said multiplexer.

13. A measurement method for evaluating a dynamic circuit as recited in claim 11 further includes the steps of providing a select signal to said multiplexer for selecting said output of the dynamic circuit to be evaluated or said pulse output of said one-shot pulse generator, and applying said selected signal to said divide-by-two circuit.

14. A ring oscillator circuit for evaluating a dynamic circuit comprising:

a one-shot pulse generator receiving a single transition input signal and producing a pulse output signal having a rising transition and falling transition;

at least one dynamic circuit to be evaluated coupled to an output of said one-shot pulse generator receiving said pulse output signal of said one-shot pulse generator and producing a delayed output pulse at an output;

a multiplexer coupled to said at least one dynamic circuit to be evaluated for receiving said delayed output pulse and said multiplexer coupled to said one-shot pulse generator for receiving said pulse output signal of said one-shot pulse generator; said multiplexer having a select signal input for selecting between said delayed output pulse of said at least one dynamic circuit to be evaluated and said pulse output signal of said one-shot pulse generator;

a divide-by-two circuit coupled to said output of said multiplexer; and an output signal of said divide-by-two circuit applied to said one-shot pulse generator.

15. A ring oscillator circuit for evaluating a dynamic circuit as recited in claim 14 includes a plurality of dynamic circuits coupled between said output of said one-shot pulse generator and said multiplexer.

16. A ring oscillator circuit for evaluating a dynamic circuit as recited in claim 15 wherein said select signal input for selecting between said delayed output pulse of said plurality of dynamic circuits and said pulse output signal of said one-shot pulse generator.

17. A ring oscillator circuit for evaluating a dynamic circuit as recited in claim 14 wherein said at least one dynamic circuit to be evaluated includes a dynamic circuit having a precharge phase and an evaluate phase; and wherein said output signal of said divide-by-two circuit switches upon one selected input transition.

18. A ring oscillator circuit for evaluating a dynamic circuit as recited in claim 17 wherein said one selected input transition includes an input rising signal or an input falling signal.

19. A ring oscillator circuit for evaluating a dynamic circuit as recited in claim 14 wherein said at least one dynamic circuit to be evaluated includes a static random access memory having one of a two input exclusive or (XOR) gate or a two input NAND gate connected to output true and compliment bitlines.

20. A ring oscillator circuit for evaluating a dynamic circuit as recited in claim 14 wherein said at least one dynamic circuit to be evaluated includes a chain of one or more dynamic circuits to be evaluated.

* * * * *